(12) United States Patent
Rai et al.

(10) Patent No.: US 9,909,350 B2
(45) Date of Patent: Mar. 6, 2018

(54) VEHICULAR REFLECTIVE OPTICAL SENSOR

(71) Applicants: Alpha Corporation, Yokohama-shi, Kanagawa (JP); Nissan Motor Co., LTD., Yokohama-shi, Kanagawa (JP)

(72) Inventors: Shun Rai, Yokohama (JP); Takashi Ono, Yokohama (JP); Kazuya Tanaka, Yokohama (JP); Wataru Hirai, Atsugi (JP)

(73) Assignees: ALPHA CORPORATION, Kanagawa (JP); NISSAN MOTOR CO., LTD., Kanagawa (JP)

( * ) Notice: Subject to any disclaimer, the term of this patent is extended or adjusted under 35 U.S.C. 154(b) by 107 days.

(21) Appl. No.: 14/917,307

(22) PCT Filed: Jul. 22, 2014

(86) PCT No.: PCT/JP2014/069300
§ 371 (c)(1),
(2) Date: Mar. 8, 2016

(87) PCT Pub. No.: WO2015/045588
PCT Pub. Date: Apr. 2, 2015

(65) Prior Publication Data
US 2016/0222714 A1 Aug. 4, 2016

(30) Foreign Application Priority Data

Sep. 24, 2013 (JP) .................................. 2013-196897

(51) Int. Cl.
*H02P 1/00* (2006.01)
*H02P 5/00* (2016.01)
(Continued)

(52) U.S. Cl.
CPC ............. *E05F 15/73* (2015.01); *G01S 7/4873* (2013.01); *G01S 7/497* (2013.01); *G01S 17/026* (2013.01);
(Continued)

(58) Field of Classification Search
CPC ... E05F 15/43; E05F 15/611; E05F 2015/434; E05F 2015/483; E05F 15/73;
(Continued)

(56) References Cited

U.S. PATENT DOCUMENTS 5,955,852 A * 9/1999 Jentsch .................... E05F 15/63
318/282
5,963,000 A * 10/1999 Tsutsumi ................ E05F 15/43
250/221

(Continued)

FOREIGN PATENT DOCUMENTS

CN 104220690 A 12/2014
DE 20 2009 018 206 U1 6/2011
(Continued)

OTHER PUBLICATIONS

Official Communication issued in International Patent Application No. PCT/JP2014/069300, dated Oct. 7, 2014.

*Primary Examiner* — Paul Ip
(74) *Attorney, Agent, or Firm* — Keating and Bennett, LLP

(57) ABSTRACT

The purpose of this invention is to provide a vehicular reflective optical sensor that has improved control reliability. Said vehicular reflective optical sensor is provided with a control unit (6) that: emits detection light (3) at prescribed intervals from a light-emitting unit (2) on an exterior panel of a vehicle towards a detection region (1) set outside said vehicle; tests for a threshold-exceeded state in which the amount of light in a light reflection (4) received from the
(Continued)

detection region (1) by a light-receiving unit (5) exceeds a prescribed detection threshold; and, if it is detected that a detection target has entered the detection region (1), outputs a detection-confirmation signal. The control unit (6) uses, as the aforementioned detection threshold, the sum of a predetermined fixed value and an adjustment value comprising a summary statistic for the amounts of light in an appropriate number of light reflections (4) preceding the light reflection (4) on which the comparison is being performed.

10 Claims, 6 Drawing Sheets

(51) Int. Cl.
| | | |
|---|---|---|
| *E05F 15/73* | (2015.01) | |
| *G01S 17/88* | (2006.01) | |
| *G01V 8/12* | (2006.01) | |
| *G01V 8/14* | (2006.01) | |
| *G01S 17/02* | (2006.01) | |
| *G01S 7/487* | (2006.01) | |
| *G01S 7/497* | (2006.01) | |
| *H03K 17/94* | (2006.01) | |

(52) U.S. Cl.
CPC ............... *G01S 17/88* (2013.01); *G01V 8/12* (2013.01); *G01V 8/14* (2013.01); *H03K 17/941* (2013.01); *E05F 2015/765* (2015.01); *E05Y 2900/532* (2013.01)

(58) Field of Classification Search
CPC ......... E05F 15/41; E05F 15/74; E05F 15/431; E05F 2015/767; E05F 15/00; E05F 15/20; E05F 15/46; E05F 15/608; E05F 15/63
USPC .................. 318/266, 280, 282, 466, 480
See application file for complete search history.

(56) References Cited

U.S. PATENT DOCUMENTS

| | | | |
|---|---|---|---|
| 6,116,640 A | 9/2000 | Tanaka et al. | |
| 6,515,740 B2* | 2/2003 | Bamji | G01S 7/493 356/141.1 |
| 6,580,496 B2* | 6/2003 | Bamji | G01S 17/36 356/141.1 |
| 6,756,910 B2* | 6/2004 | Ohba | G01V 8/10 318/286 |
| 6,906,793 B2* | 6/2005 | Bamji | G01C 3/00 348/302 |
| 7,151,350 B2* | 12/2006 | Haag | G01S 13/04 318/280 |
| 7,423,400 B2* | 9/2008 | Chinsen | E05F 15/611 318/280 |
| 7,586,280 B2* | 9/2009 | Warren | E05F 15/611 318/266 |
| 7,592,762 B2* | 9/2009 | Warren | E05F 15/611 318/266 |
| 8,589,033 B2* | 11/2013 | Rafii | E05F 15/43 318/286 |
| 2002/0036476 A1* | 3/2002 | Zengguang | G01S 17/026 318/480 |
| 2002/0118114 A1* | 8/2002 | Ohba | G01V 8/10 340/573.1 |
| 2003/0038604 A1* | 2/2003 | Study | G05B 19/4062 318/443 |
| 2004/0090203 A1* | 5/2004 | Appel | B60J 7/0573 318/480 |
| 2004/0130285 A1* | 7/2004 | Le Gallo | E05F 15/41 318/466 |
| 2004/0140782 A1* | 7/2004 | Okabe | E05F 15/43 318/445 |
| 2005/0093684 A1* | 5/2005 | Cunnien | B60Q 1/0023 340/435 |
| 2005/0174077 A1* | 8/2005 | Haag | G01S 13/04 318/280 |
| 2006/0162254 A1* | 7/2006 | Imai | E05F 15/73 49/26 |
| 2006/0267533 A1* | 11/2006 | Sasaki | E05F 15/73 318/466 |
| 2007/0299588 A1* | 12/2007 | Warren | E05F 15/611 701/49 |
| 2008/0007191 A1* | 1/2008 | Chinsen | E05F 15/611 318/280 |
| 2008/0061719 A1* | 3/2008 | Warren | E05F 15/611 318/14 |
| 2008/0180312 A1 | 7/2008 | Nakanishi | |
| 2008/0211626 A1* | 9/2008 | Shelley | E05B 81/76 340/5.72 |
| 2011/0118946 A1 | 5/2011 | Reimann et al. | |
| 2011/0276234 A1 | 11/2011 | Van Gastel | |
| 2011/0295469 A1* | 12/2011 | Rafii | E05F 15/43 701/49 |
| 2012/0158253 A1* | 6/2012 | Kroemke | B60R 25/2054 701/49 |
| 2013/0156433 A1* | 6/2013 | Blair | H03K 17/941 398/106 |
| 2013/0169408 A1 | 7/2013 | Endo | |
| 2014/0039766 A1* | 2/2014 | Miyake | B60R 25/245 701/49 |
| 2015/0006029 A1 | 1/2015 | Ono et al. | |

FOREIGN PATENT DOCUMENTS

| | | |
|---|---|---|
| EP | 0 789 127 A2 | 8/1997 |
| JP | 10-95274 A | 4/1998 |
| JP | 2003-087107 A | 3/2003 |
| JP | 2005-133529 A | 5/2005 |
| JP | 2006-245685 A | 9/2006 |
| JP | 2008-092218 A | 4/2008 |
| JP | 2009-224842 A | 10/2009 |
| JP | 2012-162908 A | 8/2012 |
| WO | 98/58869 A1 | 12/1998 |
| WO | 2012/137608 A1 | 10/2012 |

* cited by examiner (a)

(b)

(c)

VEHICULAR REFLECTIVE OPTICAL SENSOR

TECHNICAL FIELD

The present invention relates to a vehicular reflective optical sensor.

BACKGROUND ART

A structure disclosed in Patent Document 1 is known as a vehicle door opening-closing control device which controls an opening-closing operation of a vehicle door by using an infrared sensor. In this conventional example, a foot detection sensor which outputs a signal of infrared rays and the like toward the ground is mounted on a vehicle. After authentication of a portable wireless terminal held by a user, an opening-closing operation of the door takes place when the driven foot detection sensor detects the user.

Meanwhile, in the above-described conventional example, determination of the foot is performed by comparing an amount of light reflection from the foot with a prescribed detection threshold. However, the vehicle is stopped at various locations with different optical environments and brightness and other factors of a detection region set outside of the vehicle may vary depending on the stopped location. The conventional example therefore has a problem of an increase or decrease in the amount of light reflection from the foot and significant deterioration in detection reliability as a consequence.

In the meantime, as shown in Patent Document 2, moving average values of multiple pieces of data on the amounts of light reflection are often compared with a prescribed detection threshold to improve the detection accuracy. In this case, however, this configuration can only reduce or eliminate an influence of noise on an observation value, but cannot prevent deterioration in detection accuracy due to a change in the detection environment.

PRIOR ART DOCUMENTS

Patent Documents

Patent Document 1: Japanese Patent Application Publication No. 2005-133529
Patent Document 2: Japanese Patent Application Publication No. 2006-245685

SUMMARY OF THE INVENTION

Problems to be Solved by the Invention

The present invention has been made to solve the above-mentioned problems. An object of the present invention is to provide a vehicular reflective optical sensor with improved control reliability, and to provide a vehicle door opening-closing control device using the same.

Means for Solving the Problems

According to the present invention, the above-mentioned object is achieved by providing a vehicular reflective optical sensor provided with a control unit 6 that: emits detection light 3 at prescribed intervals from a light-emitting unit 2 on an exterior panel of a vehicle towards a detection region 1 set outside the vehicle; tests for a threshold-exceeded state in which the amount of light in a light reflection 4 received from the detection region 1 by a light-receiving unit 5 exceeds a prescribed detection threshold; and outputs a detection-confirmation signal if it is detected that a detection target 10 enters the detection region 1. The control unit 6 uses, as the detection threshold, a sum of a predetermined fixed value and an adjustment value including a summary statistic, and the adjustment value is calculated, based on amounts of light in an appropriate number of light reflections 4 preceding the light reflection 4 on which the comparison is being performed, at the time of reception of the light reflection 4 on which the comparison is being performed.

In the present invention, the detection threshold to be used in the detection of the threshold-exceeded state is obtained by adding the predetermined fixed value to the adjustment value obtained by statistically processing the appropriate number of light reflections 4 preceding the light reflection 4 on which the comparison is being performed. Accordingly, the stopped location or a change in optical characteristic such as brightness with a lapse of time after the stop of the vehicle is reflected to a determination standard. Thus, high detection accuracy can be maintained without being affected by the stopped location, the time, and other factors and operation reliability is therefore improved.

When a noise light reflection exceeding a prescribed noise determination threshold is detected as an object of calculation of the summary statistic, the control unit 6 may be configured to calculate the detection threshold by using a summary statistic corresponding to amounts of light of continuous non-noise light groups as an adjustment value on the condition that a prescribed number of the non-noise light following the noise light reflection and not exceeding the prescribed noise determination threshold continues.

In the present invention, the light reflection on which the comparison is being performed is subjected to noise check, and when the light reflection is determined as the noise light, the adjustment value is calculated again after disappearance of a cause of the noise. Thus, an influence of the noise light reflection on the adjustment value can be eliminated and determination accuracy is further improved.

Further, the control unit 6 may be configured to detect a new threshold-exceeded state by calculating the adjustment value by using the amount of light reflection after the output of the detection-confirmation signal even when resolution of the threshold-exceeded state is not detected on the condition that a prescribed detection resumption condition is satisfied after the output of the detection-confirmation signal.

After the output of the detection-confirmation signal, the reflective optical sensor resumes the operation to detect the threshold-exceeded state again upon detection of the resolution of the threshold-exceeded state.

In the present invention, when the prescribed detection resumption condition is satisfied after the output of the detection-confirmation signal, the adjustment value is calculated by using the amount of light reflection after the output of the detection-confirmation signal even when the resolution of the threshold-exceeded state is not detected, thereby detecting the new threshold-exceeded state.

Therefore, according to the present invention, even when the detection-confirmation signal is outputted due to a change in the optical environment and the like, it is possible to detect entry of the detection target 10 into the detection region 1 based on the detection threshold which automatically incorporates the new condition.

Meanwhile, the detection resumption condition can eliminate destabilizing factors attributed to a state of transition after the output of the detection-confirmation signal on the condition of continuation of the prescribed number of non-noise light not exceeding the prescribed noise determination threshold.

Here, if the detection resumption condition is defined as

[Formula 10]

$$-Th_{nz} < \left( \sum_{i=r-s}^{r-1} P_i \right) / s - P_r < Th_{nz},$$

then it is possible to simplify the computation as compared to the case of determining the satisfaction of the condition individually on the multiple light reflections 4. Thus, it is possible to reduce a burden on the control unit 6.

Meanwhile, the detection light 3 is emitted as a pulse group including a prescribed number of pulses, and the vehicular reflective optical sensor may be configured to determinate the threshold-exceeded state by using the pulse group as a basis of the determination.

In the present invention, the detection light 3 is emitted on the basis of the pulse group including the multiple pulses, and the threshold-exceeded state is determined on the basis of the pulse group. Thus, noise resistance is improved as compared to the case of determination based on each pulse, and determination accuracy is improved as well.

In this case, the vehicular reflective optical sensor may be configured such that the threshold-exceeded state is detected by comparing a difference between a sum of amounts of light received by the light-receiving unit 5 at the time of emission of each pulse group and a sum of amounts of light received by the light-receiving unit 5 at the time of non-emission of each pulse group with the prescribed detection threshold.

The optical environment of the stopped location of the vehicle is not specified and the brightness and other factors of the detection region 1 vary depending on the stopped location. What is more, even at the same location, conditions involving snowing, raining, sunshine, and the like constantly change in the case of stopping the vehicle outdoors. Accordingly, the detection reliably is significantly deteriorated when only the amount of light reflection at the time of light emission is used as the determination standard.

On the other hand, the present invention can surely prevent deterioration in determination accuracy attributed to a variation in reflection characteristics of background such as a wall face in the detection region 1, by defining the difference between the amount of light reflection at the time of emission and the amount of light reflection at the time of non-emission as a determination target.

Further, the control unit 6 is enable to have more improved accuracy when the control unit 6 is configured to execute a test for determining each pulse group as effective detection light only when a value equivalent to a sum of squared deviations corresponding to the difference between the sum of amounts of light received by the light-receiving unit 5 at the time of emission and the sum of amounts of light received by the light-receiving unit 5 at the time of non-emission is equal to or below a prescribed test threshold, and adopt only the effective detection light as the light reflection 4 on which the comparison is being performed.

Meanwhile, a vehicle door opening-closing control device using these vehicular reflective optical sensors may be configured to include the vehicular reflective optical sensor (A) and a door control unit configured to perform an opening operation of a vehicle door 8 by activating an actuator 7 on the condition of presence of the detection-confirmation signal of the detection target 10 from the vehicular reflective optical sensor (A).

In the present invention, when the door control unit 9 receives the detection-confirmation signal, the door control unit 9 performs the door opening operation by cancelling a locked state and outputting an opening operation signal for the vehicle door 8 to the actuator 7 on the condition of satisfaction of another prescribed condition such as authority to perform an unlocking operation authenticated by an appropriate authentication unit. As a consequence, it is possible to open the door more conveniently just by bringing a bag, a hand, and the like into the detection region 1 in the state where an unlocking condition is satisfied.

Effect of the Invention

The present invention changes the determination threshold depending on the situation, and can thus improve control reliability.

MODE FOR CARRYING OUT THE INVENTION

Figure 1:
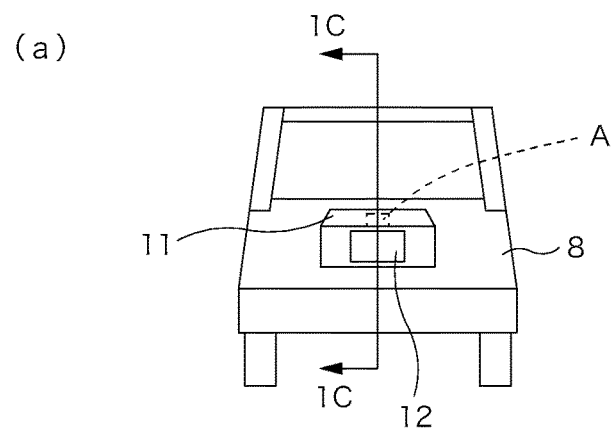
FIG. 1(a) is a rear view.
FIG. 1(b) is a side view.
FIG. 1(c) is a cross-sectional view taken along 1C-1C line in FIG. 1(a), collectively showing a vehicle which uses a vehicle door opening-closing control device.
Figure 1:
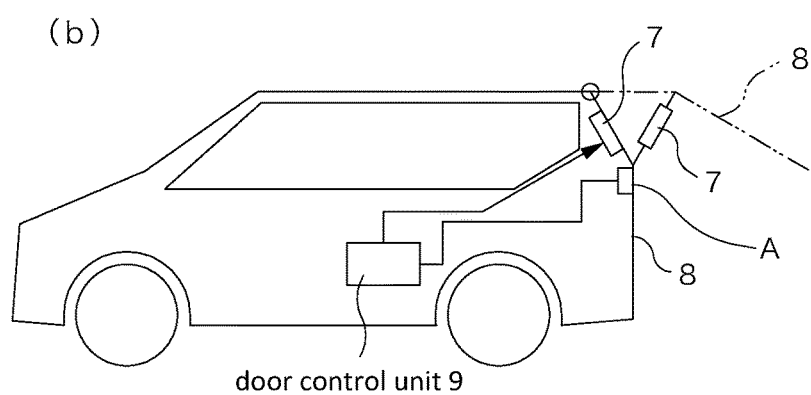
Figure 1:
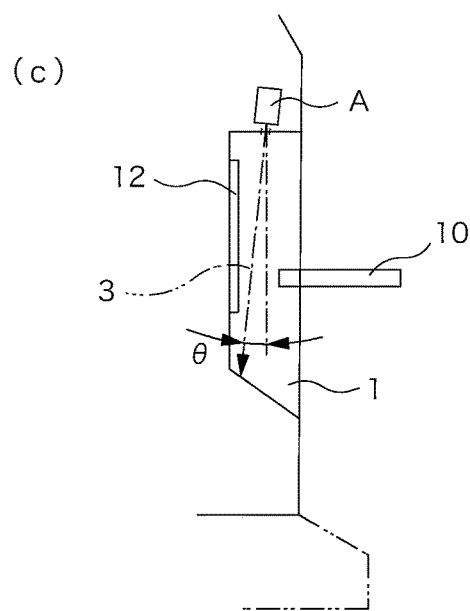

FIG. 1 shows a vehicle which uses a vehicle door opening-closing control device. In this example, the vehicle door opening-closing control device is configured as a back door control device for controlling an opening-closing operation of a powered back door to be driven by an actuator 7 such as a damper device. The vehicle door opening-closing control device includes a vehicular reflective optical sensor fixed to the back door of the vehicle, and a door control unit 9 for controlling the actuator 7.

As described later, a reflective optical sensor (A) is configured to output a detection-confirmation signal when the reflective optical sensor (A) detects entry of a detection target 10 into a prescribed detection region 1 to which detection light 3 is emitted. The reflective optical sensor (A) is fixed to a ceiling wall of a license plate attachment recess surrounded by a license plate finisher 11. Note that reference numeral 12 in FIG. 1 denotes a license plate.

Meanwhile, in this example, an optical axis of the detection light 3 is slightly tilted (by an angle θ) to the inside of the vehicle in order to locate the center of the detection region 1 of the reflective optical sensor (A) within the license plate attachment recess. This lowers detection performance outside the license plate attachment recess and thus prevents an unexpected response from the reflective optical sensor (A) in a state where a person, an animal, a trash or the like other than the user comes close to the vehicle.

In this example, when the detection-confirmation signal is outputted from the above-described reflective optical sensor (A), the door control unit 9 first performs preparatory operations including authentication of electronic key held by the user, detection of a state of the back door, a locking-unlocking operation, and the like, and then drives the actuator 7. The authentication of the electronic key is carried out by authenticating an authentication code outputted from the electronic key through communication with a not-illustrated authentication device. When the authentication is completed, a back door 8 is unlocked on the condition that the back door 8 is in a closed state. Then, an operation to open the door is started by driving the actuator 7.

Accordingly, in this embodiment, even when the user has his or her hands full carrying a bag or the like, the user can still perform the operation to open the back door 8 only by bringing the bag or the like serving as the detection target 10 into or close to the license plate attachment recess that is set as the detection region 1. Thus, this embodiment is more convenient.

Figure 2:
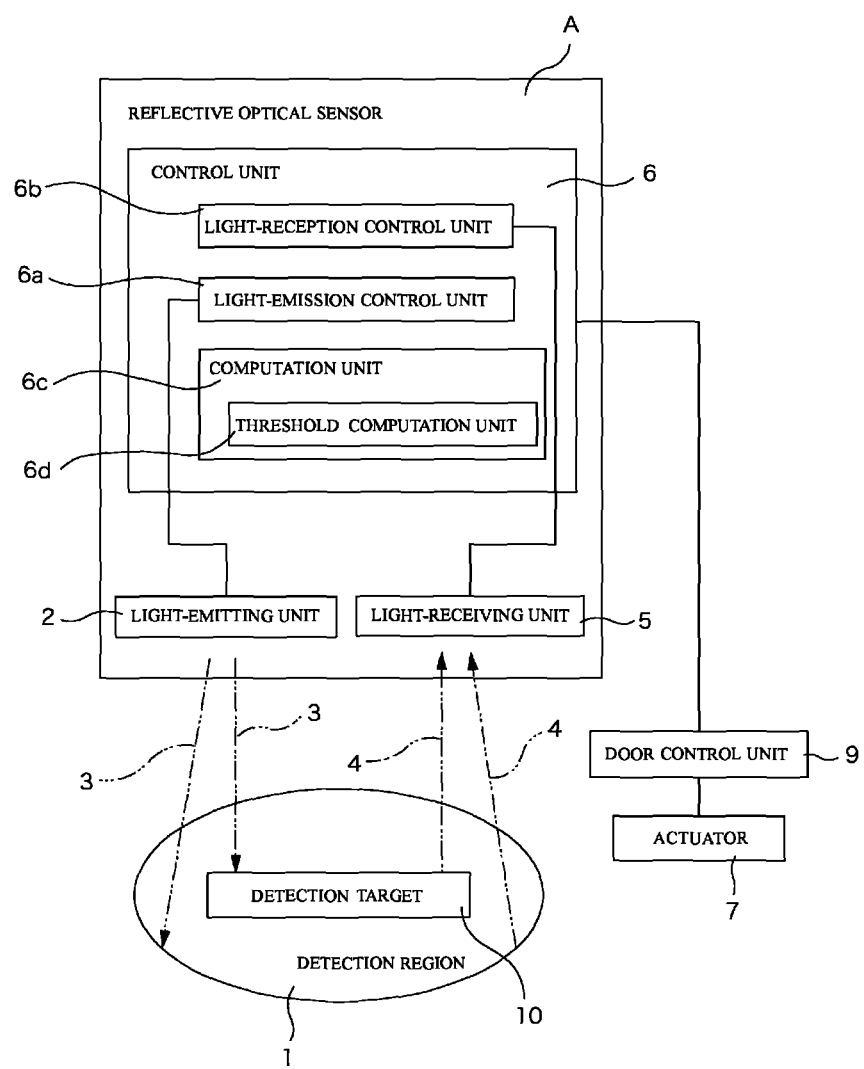
FIG. 2 is a block diagram of a reflective optical sensor.

As shown in FIG. 2, the reflective optical sensor (A) includes a light-emitting unit 2 that uses an infrared LED as a light emission source, a light-receiving unit 5 provided with a light reception circuit that includes an infrared light-receiving element, and a control unit 6. The control unit 6 includes a light-emission control unit 6a which controls light emission timing of the light-emitting unit 2, a light-reception control unit 6b which controls light reception timing of the light-receiving unit 5, and a computation unit 6c provided with a threshold computation unit 6d.

Figure 3:
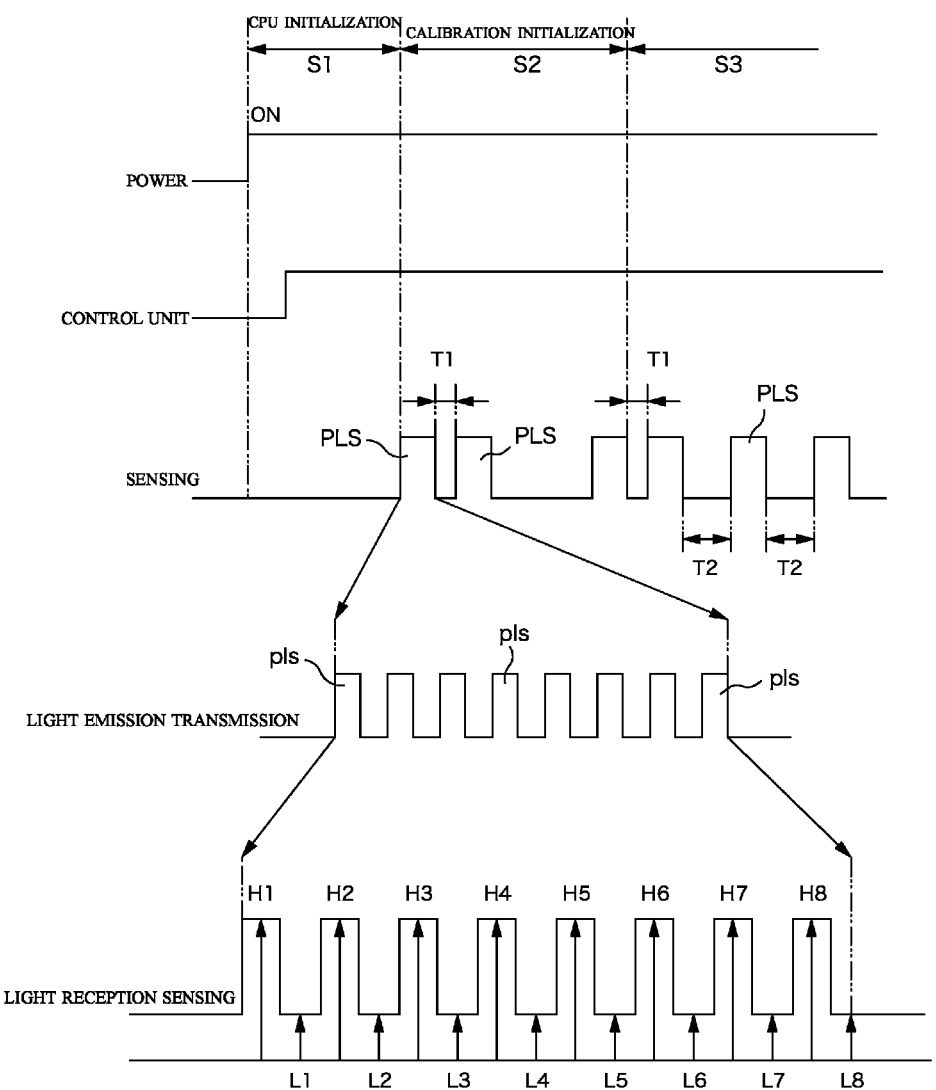
FIG. 3 is a timing chart showing operations of a control unit.

As shown in FIG. 3, under control of the light-emission control unit 6a, the light-emitting unit 2 emits detection light 3 at prescribed intervals (T1, T2 in FIG. 3), the detection light 3 on the basis of a pulse group (PLS) which is composed of an appropriate number (which is eight in this example) of pulses (pls).

The light-reception control unit 6b activates the light reception circuit from a sleep mode in accordance with the light emission timing of the pulse group (PLS) from the light-emitting unit 2 for the purpose of power saving, and acquires amounts of light received by the light-receiving unit 5 at the time of emission and at the time of non-emission of the respective emitted pulses (pls). The acquisition of the amount of light received at the time of emission of the emitted pulse (pls) is performed at the timing when a light reflection 4 corresponding to each emitted pulse (pls) reaches a peak while taking into account factors such as delay time between a point of transmission of a request to emit each pulse (pls) from the light-emission control unit 6a to the light-emitting unit 2 to a point of start of the light emission. The value is acquired as an amount (H) of light received at the time of emission.

On the other hand, the amount of light received at the time of non-emission is acquired at the timing when the light-emitting unit 2 transitions from the state of emission to the state of non-emission and an afterglow at the time of emission disappears. The value is acquired as an amount (L) of light received at the time of non-emission.

In the meantime, on the basis of the amount of light received by the light-receiving unit 5, the computation unit 6c computes an amount of light reflection on the basis of the pulse group (PLS). The amount (P) of light reflection of the pulse group (PLS) is given by:

[Formula 1]

$$P = \sum_{i=2}^{7} H_i - \sum_{i=2}^{7} L_i. \qquad (1)$$

Here, as shown in Expression (1), instability in the state of transition is eliminated by excluding the amounts ($H_1$, $L_1$) of light received corresponding to a leading-edge pulse and the amounts ($H_8$, $L_8$) of light received corresponding to a trailing-edge pulse in the course of calculating the amount of light reflection.

The light reflections 4 of the pulse groups obtained as described above are subjected to determination of validity by the computation unit 6c. The validity is to evaluate contamination by disturbance factors based on homogeneity of the amounts of light reflections within the same pulse group. A pulse group having significant fluctuations among the pulses therein, or to be more precise, a pulse group having a value equivalent to a sum of squared deviations greater than a prescribed validity test threshold ($Th_{val}$), is regarded as invalid data.

The value equivalent to the sum of squared deviations can adopt a so-called sum of squared deviations given as a sum of squares of differences between the amounts (P) of light received and an average value regarding the respective optical pulses, a variance obtained by dividing the sum of squared deviations by the number of pieces of data, a standard deviation obtained as a square root of the variance, and so forth. Meanwhile, in this example, a sum of absolute values of differences between the amounts of light received and the average value regarding the respective pulses is substituted for the value equivalent to the sum of squared deviations as shown in FIG. 2. Thus, a burden on the control unit 6 is reduced:

[Formula 2]

$$0 \le \sum_{i=2}^{7} |S_i - M| \le Th_{val} \qquad (2)$$

(where $S_i = H_i - L_i$, and M is an average of values from $S_2$ to $S_7$.)

In the meantime, the computation unit 6c performs detection of a threshold-exceeded state, detection of resolution of the threshold-exceeded state, and moreover, determination of entry of the detection target 10 into the detection region 1 by comparing the above-mentioned amount of light reflection of the pulse group with a prescribed detection threshold ($Th_{on}$). When the entry of the detection target 10 into the detection region 1 is detected, the detection-confirmation signal is outputted for a prescribed period and a confirmation signal output flag is set to indicate the output of the detection-confirmation signal.

After the output of the confirmation signal, the confirmation signal output flag is reset in the case where the resolution of the threshold-exceeded state is detected within a prescribed period, and in the case where a prescribed resolution condition is met while the threshold-exceeded state is not detected within the prescribed period. The computation unit 6c executes a step of detecting the threshold-exceeded state only when the confirmation signal output flag is in the reset state.

The detection threshold ($Th_{on}$) serving as a determination standard for the above-described threshold-exceeded state is obtained as a sum of a predetermined fixed value ($Th_{onfix}$) and an adjustment value ($Th_{cal}$). In this example, the fixed value ($Th_{onfix}$) is set to about 20% to 30% of the validity test threshold ($Th_{val}$).

Figure 4:
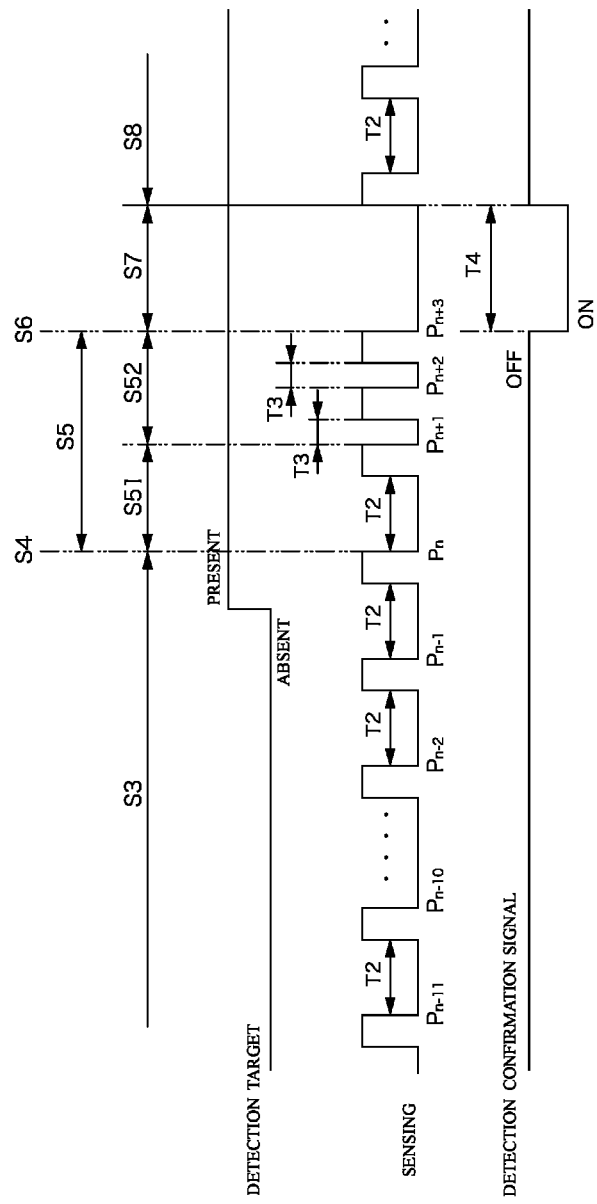
FIG. 4 is a timing chart showing detection timing of a threshold-exceeded state.

Meanwhile, as shown in FIG. 4 and Expression (3), the adjustment value ($Th_{cal}$) is given as an average value of a prescribed number (which is ten in this example) of the amounts of light received preceding a pulse group ($P_n$) of a determination target and is computed by the threshold computation unit $6d$ in the computation unit $6c$:

[Formula 3]

$$Th_{on} = Th_{onfix} + Th_{cal} \qquad (3)$$
$$= Th_{onfix} + \left(\sum_{i=n-10}^{n-1} P_i\right) / 10.$$

Here, this example shows a case where the adjustment value ($Th_{cal}$) is given as the arithmetic average of the appropriate number of the amounts of light received that are precedent. However, it is also possible to use any other appropriate values including a mode value, a median value, and the like as long as such a value is a summary statistic.

Meanwhile, in addition to the validity tests on the respective pulse groups, the above-described computation unit $6c$ executes noise determination using the above-mentioned adjustment value ($Th_{cal}$). The computation unit $6c$ informs the threshold computation unit $6d$ when the noise is detected.

The noise determination is conducted by comparing a prescribed noise determination threshold ($Th_{nz}$) with a difference between the amount ($P_n$) of light received by the pulse group of the noise determination target and the average value of ten amounts of light received preceding the amount ($P_n$) of light received, i.e., the adjustment value ($Th_{cal}$). The pulse group is determined as noise light when any of Expression (4) and Expression (5) is satisfied. In this example, the noise determination threshold ($Th_{nz}$) is set to about 5% to 8% of $Th_{onfix}$:

[Formula 4]

$$P_n - \left(\sum_{i=n-10}^{n-1} P_i\right) / 10 \geq Th_{nz} \qquad (4)$$

$$P_n - \left(\sum_{i=n-10}^{n-1} P_i\right) / 10 \leq Th_{nz}. \qquad (5)$$

Having been informed of occurrence of the noise, the threshold computation unit $6d$ observes subsequent amounts of light received and thus determines stability in the subsequent amounts of light received. The determination of stability is conducted by determining whether or not Expression (6) is satisfied by an appropriate number (which is twenty in this example) of pulse groups subsequent to the noise pulse group, or in other words, whether or not the subsequent pulse groups constitute non-noise light whose amount of light reflection remains within the noise determination threshold ($Th_{nz}$). If Expression (6) is satisfied, the threshold computation unit $6d$ determines that the subsequent pulse groups have the stability:

[Formula 5]

$$-Th_{nz} < P_n - \left(\sum_{i=n+1}^{n+20} P_i\right) / 20 < Th_{nz}. \qquad (6)$$

The threshold computation unit $6d$ determines the detection threshold ($Th_{on}$) either by defining average of ten amounts of light received preceding a determination target pulse group ($P_{n+21}$) as the adjustment value ($Th_{cal}$) as shown in Expression (7) when the threshold computation unit $6d$ determines that the subsequent pulse groups have the stability, or by defining average of the ten amounts of light received preceding the noise pulse group ($P_n$) as the adjustment value ($Th_{cal}$) as shown in Expression (8) when the threshold computation unit $6d$ determines that the subsequent pulse groups do not have the stability:

[Formula 6]

$$Th_{cal} = \left(\sum_{i=n+11}^{n+20} P_i\right) / 10 \qquad (7)$$

$$Th_{cal} = \left(\sum_{i=n-10}^{n-1} P_i\right) / 10. \qquad (8)$$

Operations of the control unit 6 are shown in FIG. 3 and so on. First, when the door control unit 9 or a not-illustrated control device such as an in-vehicle computer detects that a condition to start a detection operation by the optical sensor (A) is satisfied, a drive signal for the optical sensor (A) is outputted from the door control unit 9 or the like whereby the optical sensor (A) is powered on. The condition to start the detection by the optical sensor (A) is set as appropriate, like a stop of the vehicle detected based on such as a position of a shift lever of the vehicle, for example.

When the optical sensor (A) is powered on, a CPU of the control unit 6 is initialized for a prescribed period (step S1), and then calibration initialization is performed by the threshold computation unit 6d (step S2). During the calibration initialization, the light-emission control unit 6a maintains an emission interval (T1) of the pulse groups at about 15 (ms).

The calibration initialization is conducted by emitting a prescribed number (which is ten in this example) of pulse groups to acquire amounts of light reflections ($P_1, P_2, \ldots, P_{10}$) corresponding to the respective pulse groups, and defining an average value thereof as an initial adjustment value ($Th_{cal}$).

When the calibration initialization step is completed, the computation unit 6c monitors transition to the threshold-exceeded state while causing the light-emission control unit 6a to set an emission interval of the detection light 3 in a long-period intermittent mode of about 117 (ms) (step S3).

As shown in FIG. 4, in an exceeded state detection mode, the computation unit 6c compares the detection threshold ($Th_{on}$) with the amount (P) of light reflection as described previously, and determines that it is in the threshold-exceeded state when the following expression is satisfied:

$$P_n \geq Th_{on} = Th_{onfix} + Th_{cal} \qquad (9)$$

When the computation unit 6c detects the threshold-exceeded state (step S4), the computation unit 6c subsequently executes a testing step of the exceeded state (step S5). The testing step takes place to confirm whether or not the detected threshold-exceeded state is attributed to an intentional entry operation by a user to bring the detection target 10 into the detection region 1. A condition whether or not the detection threshold ($Th_{on}$) is surpassed continuously for a prescribed number of times (which is four times in this example) including the detection of the exceeded state, is defined as a standard for passing the test.

In order to prevent deterioration in test accuracy attributed to a change in the adjustment value ($Th_{cal}$) during the test, the detection threshold ($Th_{on}$) in the threshold-exceeded state is used as the detection threshold ($Th_{on}$) in this testing step. The condition to pass the test is to satisfy all of the following Expressions (10) to (13):

[Formula 7]

$$P_n \geq Th_{onfix} + \left(\sum_{i=n-10}^{n-1} P_i\right)/10 \quad (10)$$

$$P_{n+1} \geq Th_{onfix} + \left(\sum_{i=n-10}^{n-1} P_i\right)/10 \quad (11)$$

$$P_{n+2} \geq Th_{onfix} + \left(\sum_{i=n-10}^{n-1} P_i\right)/10 \quad (12)$$

$$P_{n+3} \geq Th_{onfix} + \left(\sum_{i=n-10}^{n-1} P_i\right)/10. \quad (13)$$

In the case of passing the test as the intended operation by satisfying the above-mentioned condition (step S6), the confirmation signal output flag is set and then the detection-confirmation signal is outputted for a prescribed period (T4) (about 150 msec) (step S7).

On the other hand, if invalid reception light exceeding the validity test threshold ($Th_{val}$) based on Expression (2) is observed before the condition is satisfied in the testing step, then the testing step is terminated to return to a monitor mode.

Meanwhile, when the threshold-exceeded state is detected in the above-described testing step, the light-emission control unit 6a generates a pulse group ($P_{n+1}$) that is immediately after the detected pulse group ($P_n$) in a long-period mode at an interval (T2) (step S51), and then transitions to a short-period mode with an emission interval (T3) reduced to about 20 (msec) (step S52). The light-emission control unit 6a stands by for the output of the detection-confirmation signal and then transitions to an exceeded state resolution detection mode (step S8).

Figure 5:
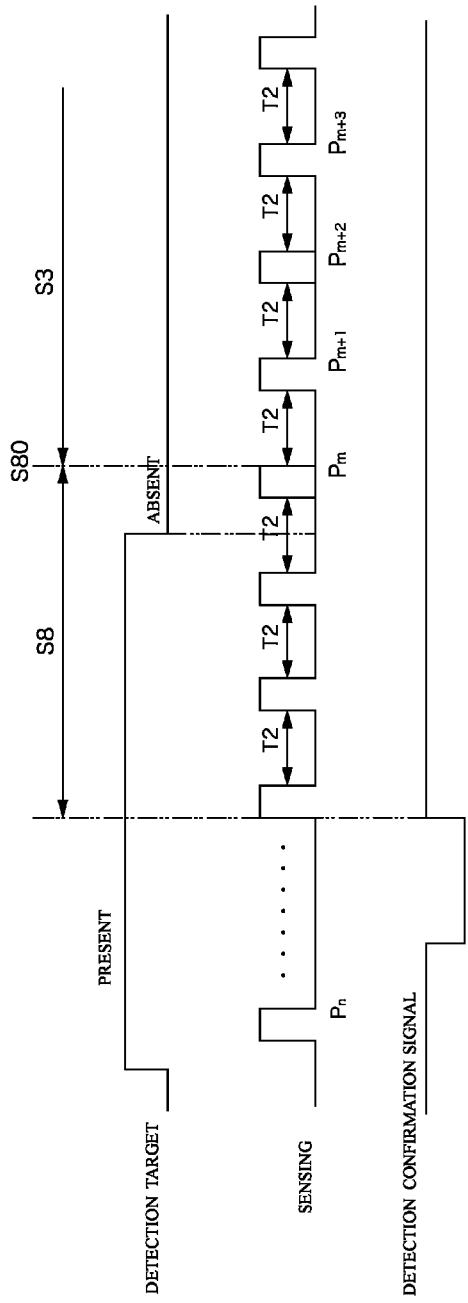
FIG. 5 is a timing chart showing detection timing of resolution of the threshold-exceeded state.

As shown in FIG. 5, resolution of the exceeded state is monitored in the exceeded state resolution detection mode while emitting the pulse groups in the long-period mode. The determination of the resolution of the exceeded state is made on the condition that the amounts of light reflections corresponding to the pulse groups fall below a detection resolution determination threshold ($T_{off}=Th_{offix}+Th_{cal}$) continuously for a prescribed number of times (which is four times in this example), or in other words, that all of the following Expressions (14) to (17) are satisfied. In this example, as with $Th_{nz}$, $Th_{offix}$ is set to about 5% to 8% of $Th_{onfix}$:

[Formula 8]

$$P_m < Th_{offix} + \left(\sum_{i=n-10}^{n-1} P_i\right)/10 \quad (14)$$

$$P_{m+1} < Th_{offix} + \left(\sum_{i=n-10}^{n-1} P_i\right)/10 \quad (15)$$

$$P_{m+2} < Th_{offix} + \left(\sum_{i=n-10}^{n-1} P_i\right)/10 \quad (16)$$

$$P_{m+3} < Th_{offix} + \left(\sum_{i=n-10}^{n-1} P_i\right)/10. \quad (17)$$

In step S8, when the resolution of the exceeded state is detected (step S80), the computation unit 6c resets the confirmation signal output flag, and returns again to the exceeded state detection mode to stand by for detection of the exceeded state (step S3). An average value of subsequent pulse groups ($P_{m+4}$, $P_{m+5}$, . . . ), in which the adjustment value used in the above-described exceeded state resolution detection mode is defined as an initial value, is used as the detection threshold ($Th_{on}$) in step S3.

Figure 6:
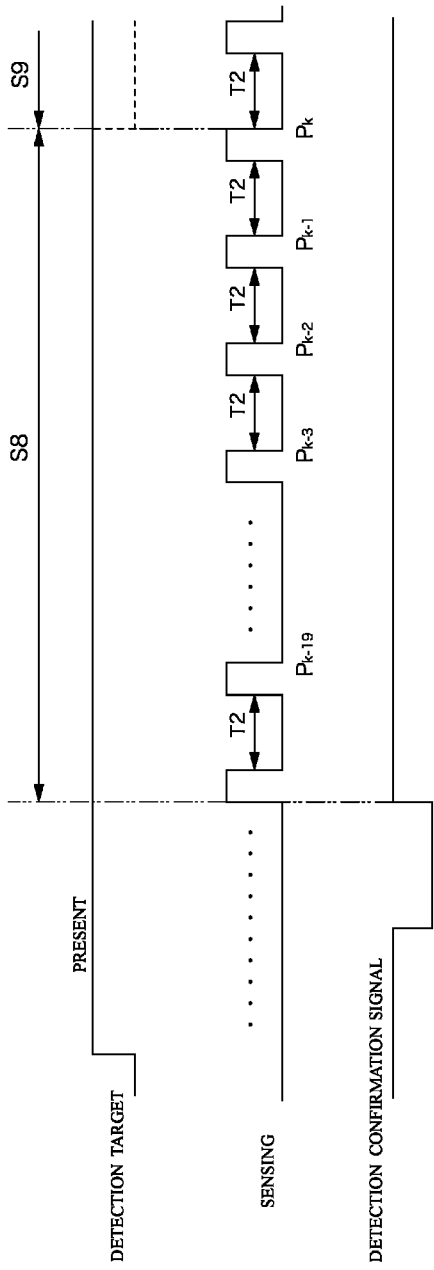
FIG. 6 is a timing chart explaining a detection resumption condition.

On the other hand, when the resolution of the exceeded state is not detected in step S8 as shown in FIG. 6, the computation unit 6c resolves the threshold-exceeded state on the condition that a detection resumption condition is satisfied. The detection resumption condition is equivalent to continuation of the non-noise light defined by Expression (6) for a prescribed number (which is twenty in this example). Along with the resolution of the threshold-exceeded state as a consequence of the satisfaction of the detection resumption condition, the computation unit 6c resets the confirmation signal output flag, and returns again to the exceeded state detection mode to stand by for detection of a new threshold-exceeded state (step S9). The value obtained by Expression (7) is used as the adjustment value ($Th_{cal}$) for the detection threshold ($Th_{on}$) in step S9.

Note that the above-described determination of the detection resumption condition can also be performed for each of the pulse groups. In this example, however, the continuous satisfaction of the condition is estimated by evaluating the twenty pulse groups as a whole as shown in Expression (18) in order to reduce a burden on a system:

[Formula 9]

$$-Th_{nz} < \left(\sum_{i=k-20}^{k-1} P_i\right)/20 - P_k < Th_{nz} \quad (18)$$

EXPLANATION OF REFERENCE NUMERALS

1 DETECTION REGION
2 LIGHT-EMITTING UNIT
3 DETECTION LIGHT
4 LIGHT REFLECTION
5 LIGHT-RECEIVING UNIT
6 CONTROL UNIT
7 ACTUATOR
8 VEHICLE DOOR

9 DOOR CONTROL UNIT
10 DETECTION TARGET
A VEHICULAR REFLECTIVE OPTICAL SENSOR

The invention claimed is:

1. A vehicular reflective optical sensor comprising:
a control unit including a processor that is configured or programmed to include:
a light-emission control unit that controls emission of light at prescribed intervals from a light-emitting unit that is located on an exterior panel of a vehicle towards a detection region set outside the vehicle, and
a computation unit that tests for a threshold-exceeded state in which an amount of light in a light reflection received from the detection region by a light-receiving unit exceeds a prescribed detection threshold, and that outputs a detection-confirmation signal if it is detected that a detection target enters the detection region, wherein
the control unit processor is configured or programmed to use, as the detection threshold, a sum of a predetermined fixed value and an adjustment value including a summary statistic, and
the adjustment value is calculated, based on amounts of light in an appropriate number of light reflections preceding the light reflection on which the comparison is being performed, at the time of reception of the light reflection on which the comparison is being performed.

2. The vehicular reflective optical sensor according to claim 1, wherein
when a noise light reflection exceeding a prescribed noise determination threshold is detected as an object of calculation of the summary statistic, the control unit processor is further configured or programmed to calculate the detection threshold by using a summary statistic corresponding to amounts of light of continuous non-noise light groups as an adjustment value on the condition that a prescribed number of the non-noise light continues following the noise light reflection, the non-noise light not exceeding the prescribed noise determination threshold.

3. The vehicular reflective optical sensor according to claim 1, wherein
on the condition that a prescribed detection resumption condition is satisfied after the output of the detection-confirmation signal, the control unit processor is further configured or programmed to detect a new threshold-exceeded state by calculating the adjustment value by using the amount of light reflection after the output of the detection-confirmation signal even when resolution of the threshold-exceeded state is not detected.

4. The vehicular reflective optical sensor according to claim 3, wherein the detection resumption condition is given by

[Formula 10]

$$-Th_{nz} < \left(\sum_{i=r-s}^{r-1} P_i\right)/s - P_r < Th_{nz},$$

in which $Th_{nz}$ is a noise determination threshold (a constant), $P_r$ is an amount of light of a light reflection of a detection resumption determination target, and s is the number (a constant) of light reflections preceding $P_r$.

5. The vehicular reflective optical sensor according to claim 1, wherein
the light is emitted as a pulse group including a prescribed number of pulses, and
the threshold-exceeded state is determined by using the pulse group as a basis of the determination.

6. The vehicular reflective optical sensor according to claim 5, wherein
the threshold-exceeded state is detected by comparing a difference between a sum of amounts of light received by the light-receiving unit at the time of emission of each pulse group and a sum of amounts of light received by the light-receiving unit at the time of non-emission of each pulse group with the prescribed detection threshold.

7. The vehicular reflective optical sensor according to claim 5, wherein
the control unit processor is further configured or programmed to execute a test for determining each pulse group as effective detection light only when a value equivalent to a sum of squared deviations corresponding to the difference between the sum of amounts of light received by the light-receiving unit at the time of emission and the sum of amounts of light received by the light-receiving unit at the time of non-emission is equal to or below a prescribed test threshold, and
the control unit processor is configured or programmed to adopt only the effective detection light as the light reflection on which the comparison is being performed.

8. The vehicular reflective optical sensor according to claim 1, wherein
the threshold-exceeded state is detected by comparing a difference between an amount of light received at the time of emission and an amount of light received at the time of non-emission subsequent to the emitted light with the prescribed detection threshold.

9. The vehicular reflective optical sensor according to claim 1, wherein
an arithmetic average value is used as the summary statistic.

10. A vehicle door opening-closing control device comprising:
the vehicular reflective optical sensor according to claim 1; and
a door control unit including a processor that is configured or programmed to perform an opening operation of a vehicle door by activating an actuator in response to the detection-confirmation signal of the detection target from the vehicular reflective optical sensor.

* * * * *